United States Patent
Yamashita

(10) Patent No.: US 10,468,852 B2
(45) Date of Patent: Nov. 5, 2019

(54) METHOD OF MANUFACTURING LIGHT EMITTING DEVICE

(71) Applicant: NICHIA CORPORATION, Anan-shi, Tokushima (JP)

(72) Inventor: Toshiaki Yamashita, Komatsushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/891,949

(22) Filed: Feb. 8, 2018

(65) Prior Publication Data

US 2018/0226770 A1  Aug. 9, 2018

(30) Foreign Application Priority Data

Feb. 9, 2017  (JP) ................. 2017-022066

(51) Int. Cl.
| | |
|---|---|
| *H01L 33/32* | (2010.01) |
| *H01L 33/50* | (2010.01) |
| *H01L 33/00* | (2010.01) |
| *H01L 33/46* | (2010.01) |
| *H01L 33/60* | (2010.01) |

(Continued)

(52) U.S. Cl.
CPC .......... *H01S 5/2027* (2013.01); *H01L 33/007* (2013.01); *H01L 33/32* (2013.01); *H01L 33/46* (2013.01); *H01L 33/502* (2013.01); *H01L 33/504* (2013.01); *H01S 5/005* (2013.01); *H01S 5/0286* (2013.01); *H01S 5/02212* (2013.01); *H01S 5/02288* (2013.01); *H01S 5/3013* (2013.01); *H01L 33/60* (2013.01); *H01L 2933/0041* (2013.01)

(58) Field of Classification Search
CPC ....................................................... H01L 33/32
See application file for complete search history.

(56) References Cited

U.S. PATENT DOCUMENTS

| 9,488,332 B2 | 11/2016 | Hayashi et al. |
| 9,490,606 B2 | 11/2016 | Okada |

(Continued)

FOREIGN PATENT DOCUMENTS

| JP | 2009-272576 A | 11/2009 |
| JP | 2015-019040 A | 1/2015 |

(Continued)

*Primary Examiner* — William A Harriston
(74) *Attorney, Agent, or Firm* — Foley & Lardner LLP

(57) ABSTRACT

A method of manufacturing a light emitting device includes: disposing a first glass that does not contain a fluorescent material on a light-reflecting member; disposing a fluorescent material containing member on the light-reflecting member via the first glass; fusing the first glass to the fluorescent material containing member at a first temperature to fix the fluorescent material containing member to the light-reflecting member; placing a second glass containing a second fluorescent material on a light emitting surface side of the fluorescent material containing member; fusing the second glass to at least one of the light-reflecting member and the first glass at a second temperature that is lower than the first temperature; and disposing a light emitting element such that light emitted from the light emitting element is irradiated on a light incident surface of the fluorescent material containing member.

13 Claims, 9 Drawing Sheets

(51) Int. Cl.
  *H01S 5/20* (2006.01)
  *H01S 5/028* (2006.01)
  *H01S 5/30* (2006.01)
  *H01S 5/00* (2006.01)
  *H01S 5/022* (2006.01)

(56) References Cited

U.S. PATENT DOCUMENTS

| | | | |
|---|---|---|---|
| 9,529,134 B2 | 12/2016 | Morizumi et al. | |
| 9,991,668 B2* | 6/2018 | Yamashita | H01S 5/02296 |
| 10,024,505 B2* | 7/2018 | Yamashita | F21V 9/30 |
| 2013/0058114 A1* | 3/2013 | Reiners | F21S 41/16 |
| | | | 362/510 |
| 2014/0160759 A1* | 6/2014 | Hayashi | H01S 5/02212 |
| | | | 362/259 |
| 2014/0160782 A1* | 6/2014 | Harada | F21V 5/008 |
| | | | 362/538 |
| 2015/0009703 A1 | 1/2015 | Morizumi et al. | |
| 2015/0077972 A1* | 3/2015 | Sugiyama | F21V 9/30 |
| | | | 362/84 |
| 2016/0091171 A1* | 3/2016 | Okada | F21V 3/061 |
| | | | 372/44.01 |
| 2016/0186936 A1* | 6/2016 | Kiyota | H01S 5/02296 |
| | | | 362/84 |
| 2017/0063033 A1* | 3/2017 | Morizumi | G02B 6/0008 |
| 2017/0137706 A1 | 5/2017 | Fujita et al. | |
| 2018/0226770 A1* | 8/2018 | Yamashita | H01S 5/2027 |

FOREIGN PATENT DOCUMENTS

| | | |
|---|---|---|
| JP | 2015-029034 A | 2/2015 |
| JP | 2015-060871 A | 3/2015 |
| JP | 2016-027613 A | 2/2016 |
| JP | 2016-072513 A | 5/2016 |
| JP | 2016-122692 A | 7/2016 |
| WO | WO-2015/178223 A1 | 11/2015 |

* cited by examiner

METHOD OF MANUFACTURING LIGHT EMITTING DEVICE

CROSS-REFERENCE TO RELATED PATENT APPLICATION

This application claims priority under 35 U.S.C. § 119 to Japanese Patent Application No. 2017-022066 filed on Feb. 9, 2017, the contents of which are hereby incorporated by reference in their entirety.

BACKGROUND

The present disclosure relates to a method of manufacturing a light emitting device.

Light emitting devices are known that employ a combination of a semiconductor laser element and an optical component. For example, Japanese Unexamined Patent Application Publication No. 2016-072513 describes an optical component that includes a support member having an inner lateral surface defining a through-hole, and a second light-transmissive member fixed on the inner lateral surface by fusing a first light-transmissive member. The optical component may further include a third light-transmissive member fixed on the second light-transmissive member by fusing. Glass is an example of a material of the first light-transmissive member.

SUMMARY

As a result of further study on a light emitting device having such an optical component, the present inventor has found an improvement in the optical output of the light emitting device with the use of a certain temperature at the time of fusing glass.

The embodiments include aspects described below. According to one embodiment, a method of manufacturing a light emitting device includes: disposing a first glass, which does not contain a fluorescent material, on a light-reflecting member; disposing a fluorescent material containing member on the light-reflecting member via the first glass; fusing the first glass to the fluorescent material containing member at a first temperature, to fix the fluorescent material containing member to the light-reflecting member; placing a second glass, which contains a second fluorescent material, on the light emitting surface side of the fluorescent material containing member; fusing the second glass to at least one of the light-reflecting member and the first glass at a second temperature that is lower than the first temperature; and disposing a light emitting element such that light emitted from the light emitting element is irradiated on a light incident surface of the fluorescent material containing member. Either (i) the fluorescent material containing member comprises a ceramic that contains a first fluorescent material, or (ii) the fluorescent material containing member consists essentially of a single crystal of a first fluorescent material.

Accordingly, a light emitting device of improved optical output can be obtained.

DETAILED DESCRIPTION

Figure 1A:
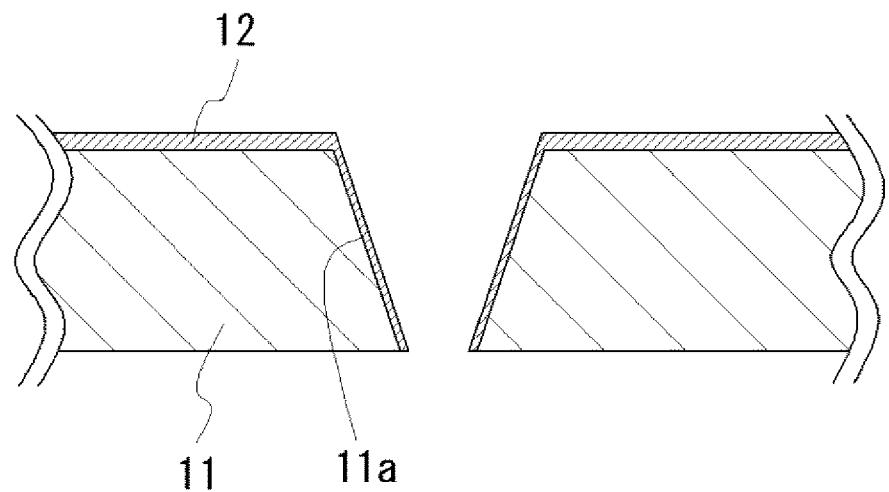
FIG. 1A is a schematic cross-sectional view illustrating a method of manufacturing a light emitting device according to one embodiment of the present invention.

Certain embodiments of the present invention will be described below with reference to the accompanying drawings. It is to be noted that the light emitting device described below is intended for implementing the technical concepts of the present invention, and the present invention is not limited to those described below unless otherwise specified. The size, positional relationship and the like in the drawings may be exaggerated for the sake of clarity.

A method of manufacturing a light emitting device 100 according to one embodiment of the present disclosure includes, as shown in FIG. 1A to FIG. 2C: (a) disposing a first glass 12, which does not contain a fluorescent material, on a light-reflecting member 11; (b) disposing a fluorescent material containing member 13 on the light-reflecting member 11 via the first glass 12; (c) fusing the first glass 12 to the fluorescent material containing member 13 at a first temperature, to fix the fluorescent material containing member 13 to the light-reflecting member 11; (d) placing a second glass 14, which contains a second fluorescent material, on the light emitting surface 13b side of the fluorescent material containing member 13; (e) fusing the second glass 14 to at least one of the light-reflecting member 11 and the first glass 12 at a second temperature that is lower than the first temperature; and (f) disposing a light emitting element 21 such that light emitted from the light emitting element 21 irradiates the light incident surface 13a of the fluorescent material containing member 13. Either (i) the fluorescent material containing member 13 comprises a ceramic that contains a first fluorescent material, or (ii) the fluorescent material containing member 13 consists essentially of a single crystal of a first fluorescent material.

Figure 2A:
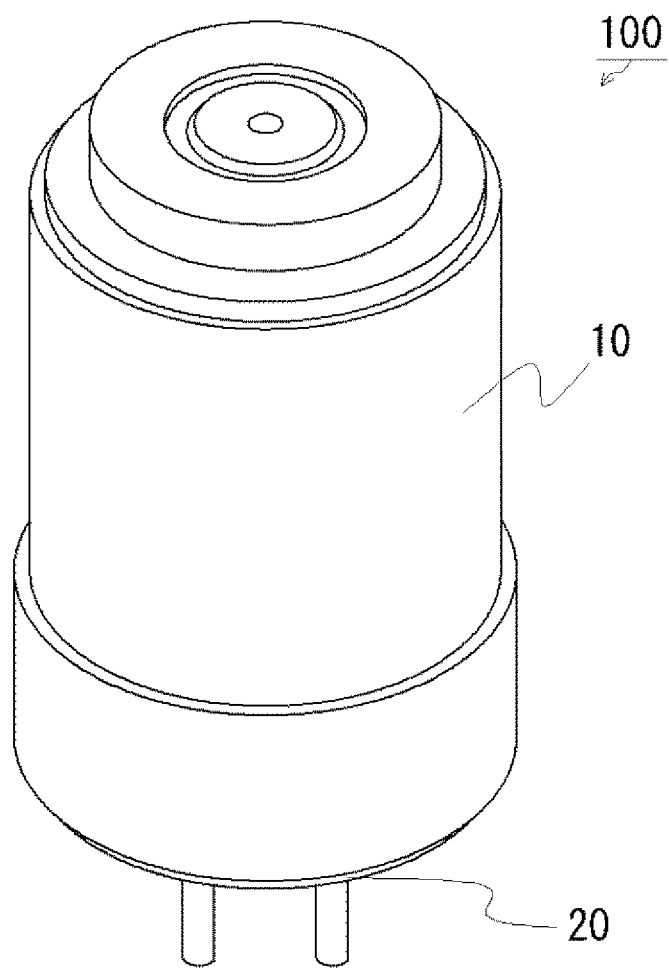
FIG. 2A is a schematic perspective view illustrating a method of manufacturing a light emitting device according to one embodiment of the present invention.
Figure 2B:
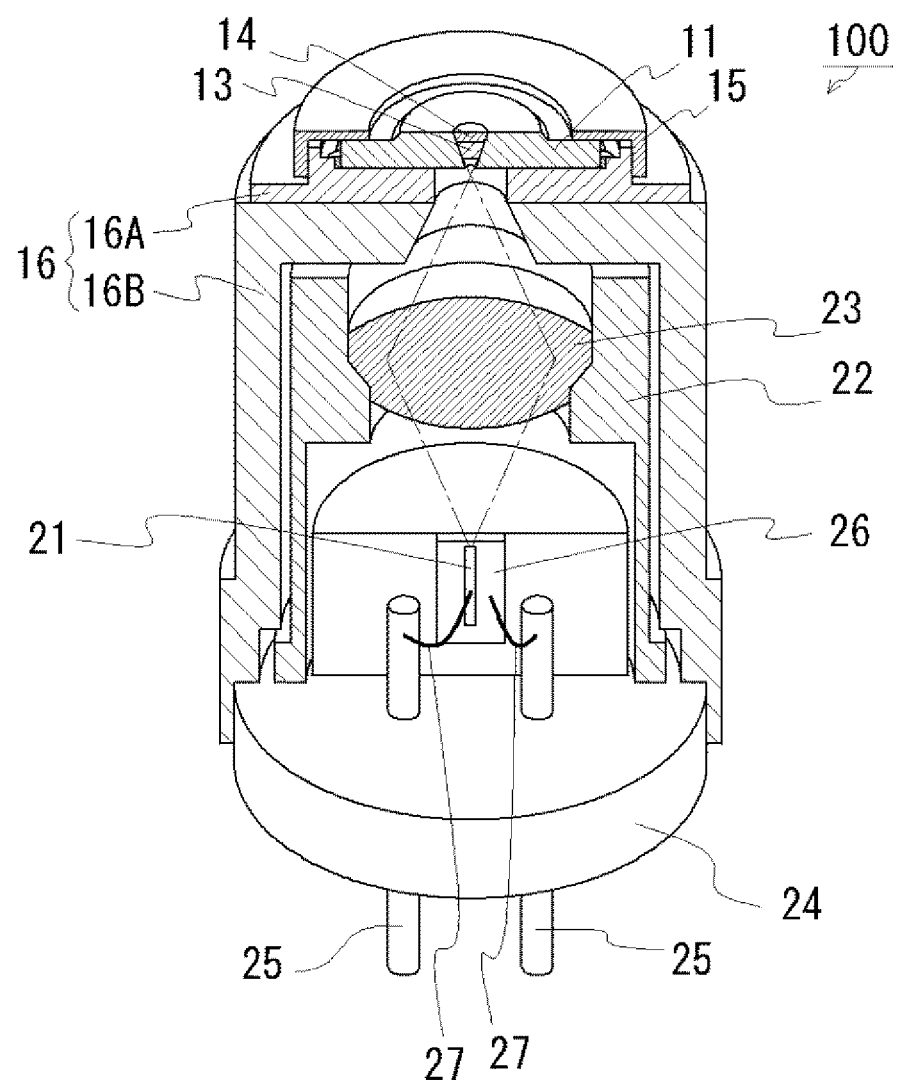
FIG. 2B is a schematic perspective view, partially in cross-section of a light emitting device shown in FIG. 2A.
Figure 2C:
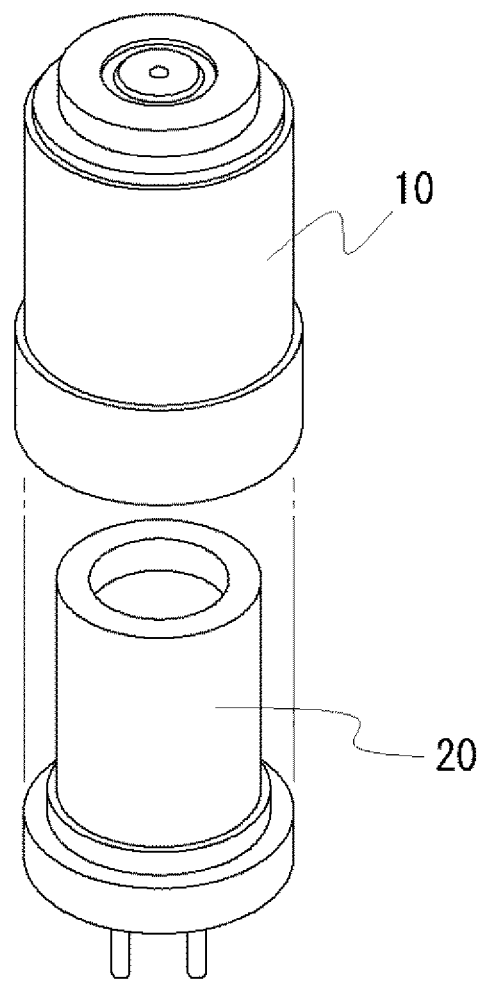
FIG. 2C is an exploded perspective view of the light emitting device shown in FIG. 2B.

Through such steps, the light emitting device 100 shown in FIG. 2A to FIG. 2C can be obtained. The light emitting device 100 includes an optical component 10 and a package 20. The optical component 10 includes the fluorescent material containing member 13 formed through the steps (a) to (e). The package 20 includes a light emitting element 21. Such components are arranged so that light emitted from the light emitting element 21 is irradiated on a light incident surface 13a of the fluorescent material containing member 13. The respective steps will be described below.

(a) Disposing First Glass

As shown in FIG. 1A, a first glass 12 is disposed on a light-reflecting member 11. The light-reflecting member 11 include a surface capable of receiving light from the light emitting element 21 to be described further below, and at least the surface capable of receiving light is a light-reflecting surface having a high reflectance. At least a portion of the first glass 12 is disposed on the light-reflecting surface. The light-reflecting member 11 has a reflectance to light emitted from the light emitting element 21, which is at least at the light-reflecting surface preferably 70% or greater, more preferably 90% or greater.

As shown in FIG. 1A, the light-reflecting member 11 may include one or more inner lateral surface 11a that define a through-hole to allow propagation of the light. Thus, the one or more inner lateral surfaces are formed as light-reflecting surfaces. Accordingly, the first glass 12 is disposed at least on the one or more inner lateral surfaces 11a defining the through-hole.

For the light-reflecting member 11, a material that can withstand fusing of the first glass 12 is used. More specifically, a material having a melting point higher than the temperatures used for fusing of the first glass 12 and the second glass 14 is used. A material having a melting point of 1000° C. or greater is preferable, and 1500° C. or greater is more preferable.

Examples of the material of the light-reflecting member 11 include a ceramic, a metal, and a composite of a ceramic and a metal. When a ceramic is used, an alumina ceramic ($Al_2O_3$) having high thermal conductivity and high reflectance can be preferably used. The light-reflecting member 11 preferably has a thickness of 0.2 mm or greater, in view of mechanical strength. The light-reflecting member 11 has a thickness that can support the fluorescent material containing member 13 and the second glass 14. Meanwhile, in order to minimize a rise in cost and height of the light emitting device 100, the thickness of the light-reflecting member 11 can be 2 mm or less.

In FIG. 1A, opening of the through-hole defined in the light-reflecting member 11 increases in a propagation direction of the light. Thus, returning light of incident light can be reflected at the inner lateral surface 11a of the through-hole and efficiently extracted to the light emitting side. The through-hole can be formed with a polygonal opening such as a triangular opening, a quadrangular opening, or the like, or a circular opening or an elliptic opening. The through-hole can be a columnar through-hole, a conical or pyramidal through-hole, or a combination of these.

The first glass 12 may also be disposed on the upper surface (surface at light emission side) and/or the lower surface (surface at light incident side) of the light-reflecting member 11. The first glass 12 is used to fix the light-reflecting member 11 and the fluorescent material containing member 13 to be described below. When the through-hole is formed in the light-reflecting member 11, the first glass 12 is preferably disposed in a film-shape on the one or more inner lateral surfaces defining the through-hole. If the thickness of the first glass is too thin on the one or more inner lateral surfaces 11a defining the through-hole, portions that are not covered by the first glass 12 tend to occur, and if the thickness is too thick, absorption of light may increase, resulting in a reduction in the light emitting efficiency. Accordingly, the thickness of the first glass 12 on the one or more inner lateral surfaces 11a defining the through-hole is preferably in a range of about 0.1 to about 20 more preferably in a range of about 1 μm to about 10 The first glass 12 may be disposed by, for example, sputtering. By sputtering, the thickness of the first glass 12 at the upper surface and/or the lower surface of the light-reflecting member 11 tends to be greater than the thickness of the first glass 12 on the one or more inner lateral surfaces 11a defining the through-hole.

The first glass 12 has light-transmissive property. Examples of material of the first glass 12 include borosilicate glass, soda-lime glass, soda glass, and lead glass. For example, borosilicate glass having a softening point in a range of 500° C. to 900° C. can be used for the first glass 12.

(b) Disposing Fluorescent Material Containing Member

Figure 1B:
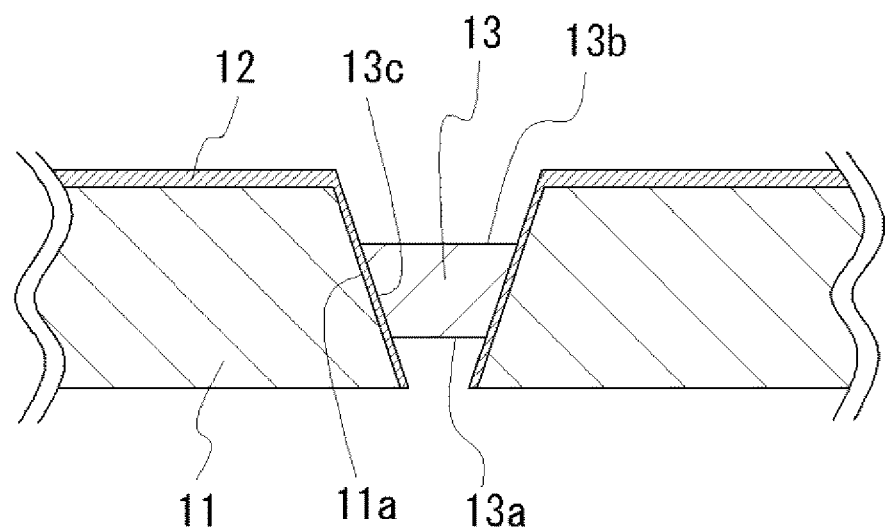
FIG. 1B is a schematic cross-sectional view illustrating a method of manufacturing a light emitting device according to one embodiment of the present invention.

As shown in FIG. 1B, the fluorescent material containing member 13 having the light incidence surface 13a and the light emitting surface 13b is disposed on the light-reflecting member 11 via the first glass 12.

The fluorescent material containing member 13 contains a first fluorescent material that emits fluorescent light when excited by excitation light. The excitation light is the light emitted from the light emitting element 21 to be described below. Examples of the fluorescent material include a yttrium aluminum garnet (YAG) activated with cerium, a lutetium aluminum garnet (LAG) activated with cerium, a nitrogen-containing calcium aluminosilicate (CaO—$Al_2O_3$—$SiO_2$) activated with europium and/or chromium, a silicate activated with europium (($Sr,Ba)_2SiO_4$), α-sialon phosphor, and β-sialon phosphor. For the first fluorescent material, a YAG phosphor that has good heat-resisting properties is preferably used.

As shown in FIG. 1A, when the light-reflecting member 11 is formed with a through-hole, the fluorescent material containing member 13 is placed in the through-hole. The fluorescent material containing member 13 can further include one or more lateral surfaces 13c connecting the light incidence surface 13a and the light emitting surface 13b. The one or more lateral surfaces 13c are, as shown in FIG. 1B, formed approximately in conformity to the one or more inner lateral surfaces 11a defining the through-hole. Thus, adhesion with the light-reflecting member 11 can be improved and heat generated in the fluorescent material containing member 13 can be efficiently released to the light-reflecting member 11 side. On the other hand, forming such a shape completely in conformity is difficult, so that the one or more lateral surfaces 13c may have a different inclination angle than that of the one or more inner lateral surfaces 11a defining the through-hole. For example, the fluorescent material containing member 13 may have an inverted taper shape so that when the fluorescent material containing member 13 is placed in the through-hole, a distance from the one or more inner lateral surfaces 11a defining the through-hole to the fluorescent material containing member 13 is smaller at the light emitting surface 13b side than at the light incidence surface 13a side. Such a shape can reduce the difference in the distances of the light incidence surfaces 13a from the top ends of the through-holes, which allows for a reduction in the difference in the thicknesses of the second glass 14 in the state shown in FIG. 1E. Accordingly, difference in chromaticities of light emitted from the light emitting devices 100 can be reduced. The light incidence surface 13a and the light emitting surface 13b can be arranged substantially perpendicular to an axis indicating propagating direction of the light emitted from the light emitting element 21, that is, to the optical axis. For example, the light incidence surface 13a and the light emitting surface 13b of the fluorescent material containing member 13 are flat surfaces opposite from each other and substantially in parallel to each other.

The fluorescent material containing member 13 is made of ceramics containing a first fluorescent material or made of a single crystal of the first fluorescent material. The fluorescent material containing member 13 is made of a material having good light-resisting properties and good heat-resisting properties as described above, so that degradation hardly occurs even when the fluorescent material containing member 13 is irradiated with high-density light such as a laser light. The fluorescent material containing member 13 is preferably made of a material having a melting temperature higher than the fusing temperature of the first glass 12 and the second glass 14. The material of the fluorescent material containing member 13 has a melting temperature, for example, in a range of 1,300° C. to 2,500° C., more preferably in a range of 1,500° C. to 2,200° C. The use of a material having such a high melting point can reduce the possibility the fluorescent material containing member 13 melting, and further can inhibit deformation and discoloration of the fluorescent material containing member 13. Accordingly, the desired optical characteristics can be maintained for a long period of time. The fluorescent material containing member 13 has a thickness, for example, in a range of 0.1 mm to 1.5 mm. The fluorescent material containing member 13 can be, for example, a fluorescent material ceramics that is obtained by sintering the first fluorescent material with a light-transmissive material such as aluminum oxide ($Al_2O_3$, melting point in a range of about 1,900° C. to about 2,100° C.). In this case, the content of the first fluorescent material with respect to the total weight of the fluorescent material containing member 13 is preferably in a range of 0.05 to 50 weight %, more preferably in a range of 1 to 30 weight %. Alternatively, without using such a light-transmissive material, a fluorescent material ceramics obtained by sintering powder form of the first fluorescent material, thus substantially only made of the first fluorescent material can also be used as the fluorescent material containing member 13. Also, single crystal of the first fluorescent material may be used for the fluorescent material containing member 13. The surfaces of the fluorescent material containing member 13 may be provided with a coating such as a band pass filter.

(c) Fixing Fluorescent Material Containing Member

The first glass 12 is thermally welded to the fluorescent material containing member 13 at a first temperature to fix the fluorescent material containing member 13 to the light-reflecting member 11. The first glass 12 is solid at room temperature, but it will melt or soften at a temperature of heat treatment, and will solidify when returned to room temperature. Thus, the fluorescent material containing member 13 is fixed to the light-reflecting member 11. The first temperature is higher than the second temperature to be described below. Thus, fusing the first glass 12 to the light-reflecting member 11 or the like at a relatively high temperature of the first temperature allows for an improvement in the reflectance of the surface provided with the first glass 12.

Figure 3:
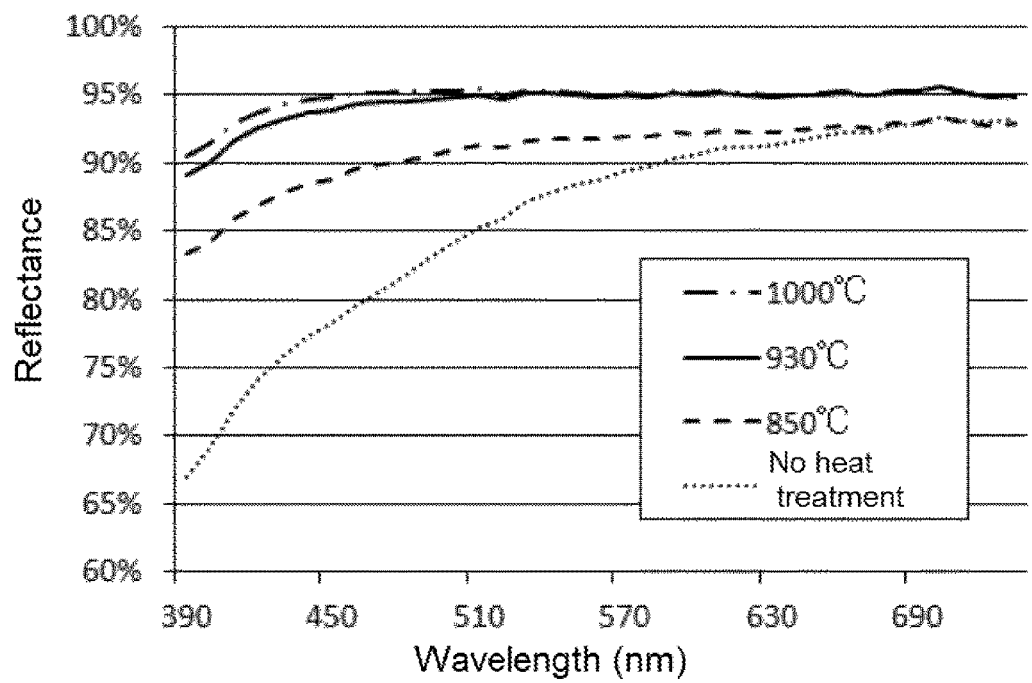
FIG. 3 is a graph showing the differences in reflectance of a first glass on a surface of a light-reflecting member due to different first temperatures in heat treatment condition.

FIG. 3 is a graph showing the differences in reflectance of a first glass on a surface of a light-reflecting member due to different first temperatures during heat treatment. To facilitate measuring the reflectance, the first glass was disposed on one main surface of a plate-shaped member made of the same material as that of the light-reflecting member 11 and the reflectance was measured. For the plate-shaped member made of the same material as that of the light-reflecting member 11, an alumina ceramic containing zirconium was used, and for the first glass, borosilicate glass was used. The first glass was disposed with a thickness of about 1.5 μm on one main surface of the plate-shaped member. Then, at the first temperature, the first glass was thermally welded to the plate-shaped member and the reflectance of the surface was measured. The reflectance of the first glass 12 disposed side was measured. In FIG. 3, the dotted line indicates without a heat treatment for fusing, the broken line indicates heat treatment at the first temperature of 850° C. for 20 minutes, the solid line indicates heat treatment at the first temperature of 930° C. for 20 minutes, and the alternate long and short dashed line indicates heat treatment at the first temperature of 1,000° C. for 20 minutes. The reflectance of the light-reflecting member 11 that did not have the first glass 12, that is, the reflectance of the light-reflecting member 11 alone, and subjected to the same heat treatment conditions was measured, and is shown in FIG. 4.

Figure 4:
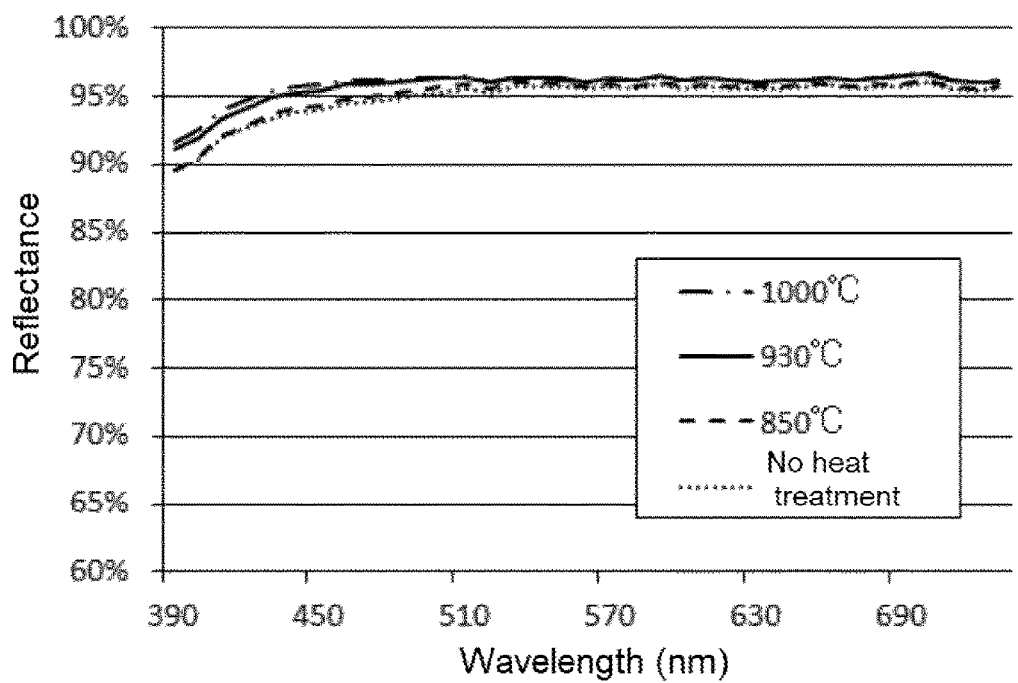
FIG. 4 is a graph showing the differences in reflectance of the light-reflecting member due to the different first temperatures in the heat treatment condition as in FIG. 3.
Figure 5:
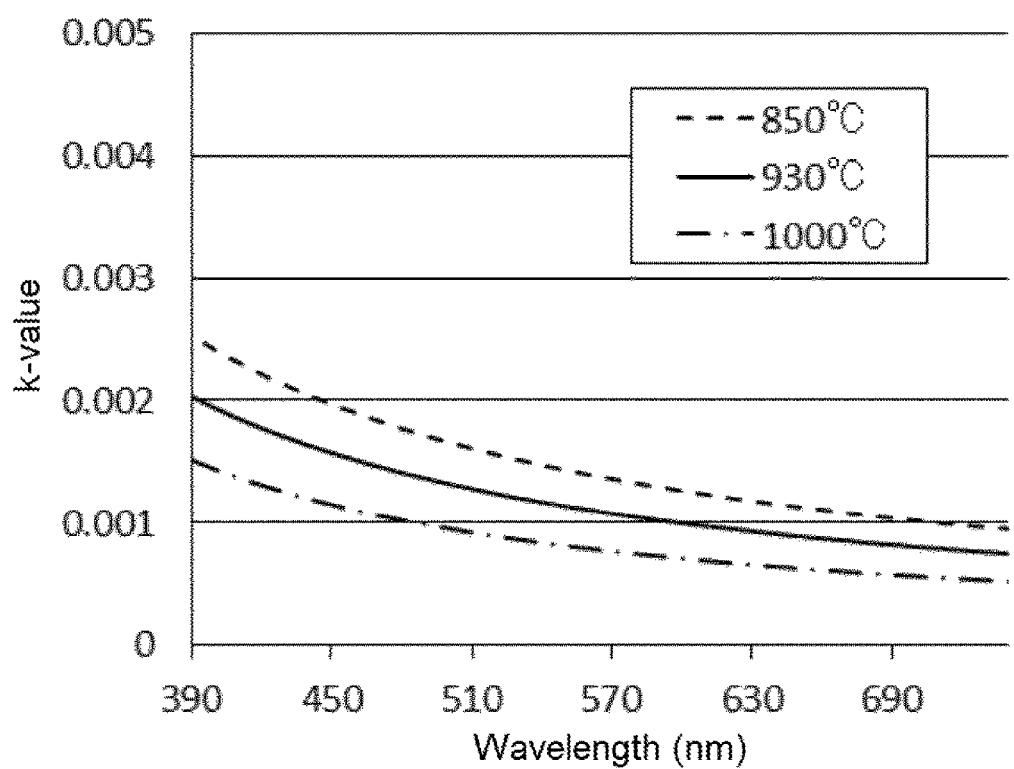
FIG. 5 is a graph showing extinction coefficients of the first glass due to the different first temperatures in the heat treatment condition as in FIG. 3.

FIG. 3 and FIG. 4 show that the reflectance when using the first glass is lower than the reflectance without using the first glass. Coloration was observed by visual examination of the first glass that was not subjected to a heat treatment. The first glass that was not subjected to a heat treatment exhibits relatively high optical absorption, which is thought to cause the reduction in the reflectance when the first glass 12 is used but is not subjected to a heat treatment. As shown in FIG. 3, the reflectance rises when heat treatment is used in fusing, and a greater rise in the reflectance can be obtained by higher first temperature. As shown in FIG. 4, a greater increase in the reflectance of the light-reflecting member 11 can be observed with a higher first temperature, but a greater increase in the reflectance is shown in FIG. 3. FIG. 5 is a graph showing extinction coefficients of the first glass due to the different first temperatures in the heat treatment condition as in FIG. 3. As shown in FIG. 5, the greater the first temperature, the smaller the extinction coefficient of the first glass 12 was. From the results shown above, the first glass 12 is a member exhibiting large amount of optical absorption when it is not subjected to a heat treatment, but with a high first temperature at the time of fusing, the first glass 12 is thought to approach transparent state. When the heat treatment is performed at a higher temperature, unintended components can be easily exhausted from the first glass 12; thus, when the first temperature is higher, greater reduction in the optical absorption is assumed.

Figure 6:
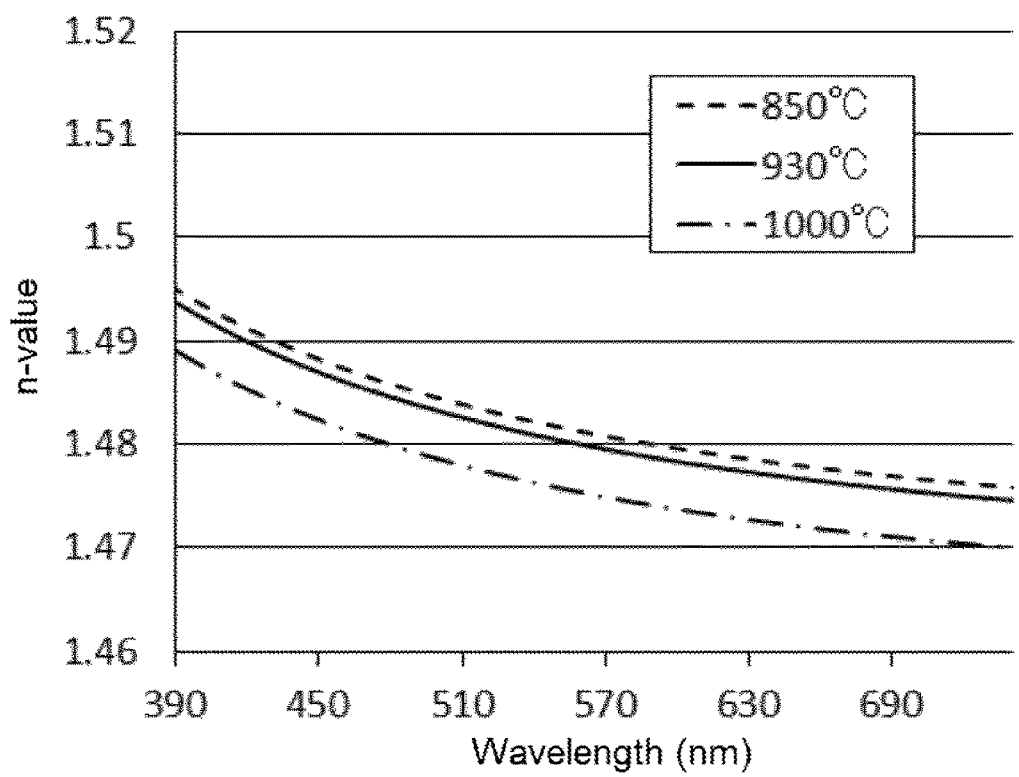
FIG. 6 is a graph showing refractive indexes of the first glass due to the different first temperatures in the heat treatment condition as in FIG. 3.

Also, the measurement samples similar to those in FIG. 3 were subjected to heat treatment as in the heat treatment conditions as in FIG. 3, and the refractive index of the first glass 12 was measured. The results thereof are shown in FIG. 6. As shown in FIG. 6, the greater the first temperature, the smaller refractive index of the first glass 12 was. When the fluorescent material containing member 13 is made of alumina and a YAG phosphor, at a wavelength of 450 nm, the refractive index of alumina is about 1.78 and a YAG phosphor is about 1.85, both of which are greater than that of the refractive index of the first glass 12. Accordingly, when the first temperature is increased, the refractive index of the first glass 12 can be decreased, which can increase the difference in the refractive index with the fluorescent material containing member 13. This is assumed to facilitate confinement of light in the fluorescent material containing member 13.

As shown in FIG. 3, compared to the case without the heat treatment, when the first temperature is 850° C., the reflectance in a shorter wavelength range increases but the reflectance in a longer wavelength range hardly changes. Comparatively, when the first temperature is 930° C. or greater, an increase in the reflectance is observed in a wide wavelength range that includes longer wavelength range. Thus, when the first glass 12 is made of borosilicate glass, the first temperature is preferably 930° C. or greater. Accordingly, the luminous flux of the light emitting device 100 can be increased. When the first temperature is 900° C., the luminous flux of the light emitting devices 100 may easily vary, but at 930° C. or greater, an increase in luminous flux can be achieved stably. Further, when the first temperature is 1,000° C. or greater, the luminous flux of the light emitting device 100 can be further increased. If the first temperature is too high, the light-conversion efficiency of the first fluorescent material contained in the fluorescent material containing member 13 may decrease, so that the first temperature is preferably set so as not to cause such a decrease in the efficiency. When the fluorescent material containing member 13 contains a YAG phosphor as the first fluorescent material, the first temperature is preferably 1,500° C. or less. The first temperature may be 1,300° C. or less.

As shown in FIG. 3, a change in the reflectance due to heat treatment is particularly apparent in a short wavelength range. The excitation light has a wavelength shorter than the fluorescent light emitted from the first fluorescent material, so that a rise in the reflectance due to a rise in the first temperature can affect greatly to the excitation light, which is the light from the light emitting element 21. For this reason, the first temperature can be determined based on the reflectance of the excitation light. When the reflectance of the excitation light of the light-reflecting member 11 that is not provided with the first glass 12 is assumed to be 1, the first temperature is preferably a temperature at that the reflectance of excitation light the light-reflecting member 11 provided with the first glass 12 is 0.95 or greater. Further, the first temperature is preferably a temperature that can obtain the reflectance of excitation light of 0.98 or greater. Accordingly, the luminous flux of the light emitting device 100 can be increased. For example, when the wavelength of the excitation light is 450 nm and the first temperature is 930° C. as shown in FIG. 3 and FIG. 4, the reflectance of excitation light of the light-reflecting member 11 provided with the first glass 12 is about 0.98 with respect to that of the light-reflecting member 11 which does not provided with the first glass 12. The reflectance of excitation light at 850° C. is about 0.94 and at 1,000° C. is about 0.99. The term "reflectance of excitation light" refers to a reflectance at a peak wavelength of light emitted from the light emitting element 21. The first temperature used in the manufacturing of the light emitting device 100 can be determined based on pre-test using samples for measurement.

In the present specification, the terms "first temperature" and "second temperature" indicate the temperature in a furnace such as an electric furnace used for the heat treatment. The heat treatment is performed, for example, by raising the temperature to the first temperature and maintaining the first temperature for a predetermined period of time, then reducing the temperature. In the present specification, the term "duration of heat treatment" indicates the period of time in which the first temperature is maintained.

As shown in FIG. 1B, when the light-reflecting member 11 is formed with a through-hole, the fluorescent material containing member 13 is fixed to the one or more inner lateral surfaces 11a defining the through-hole in the step (c). The heat treatment at the first temperature may be performed while pressing the fluorescent material containing member 13 to the light-reflecting member 11. This allows for firmer fixing, so that the fluorescent material containing member 13 can be firmly fixed to the through-hole of the light-reflecting member 11. When the pressing is applied during the heat treatment, for example, the fluorescent material containing member 13 can be placed in the furnace with a weight placed on the light emitting surface 13b of the fluorescent material containing member 13.

(d) Disposing Second Glass

Figure 1C:
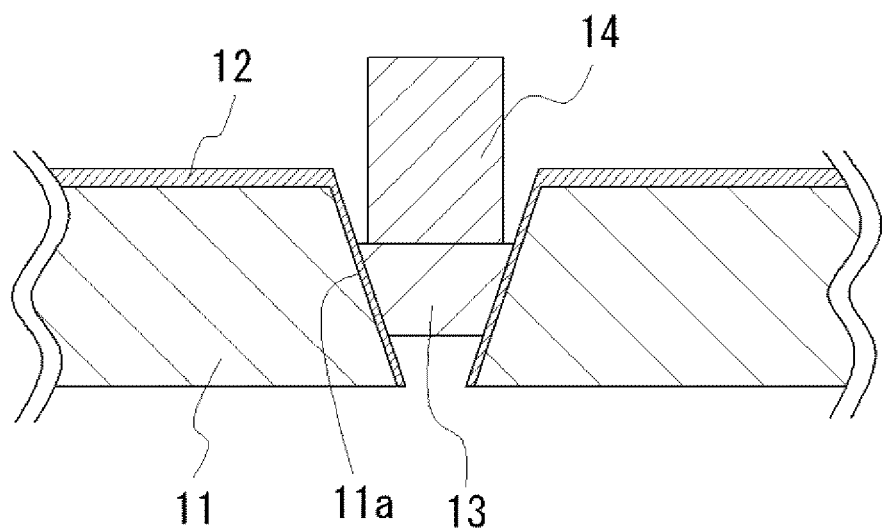
FIG. 1C is a schematic cross-sectional view illustrating a method of manufacturing a light emitting device according to one embodiment of the present invention.

As shown in FIG. 1C, the second glass 14 containing a second fluorescent material is placed on the light emitting surface 13b side of the fluorescent material containing member 13.

The second glass 14 contains the second fluorescent material, so that it is difficult to dispose by sputtering as in the first glass 12. Accordingly, as shown in FIG. 1C, it is preferable that a piece of second glass 14 having a shape such as a polygonal columnar shape is provided and placed on the fluorescent material containing member 13. The location to place the second glass 14 is such that when the second glass 14 is melted or softened, it covers the light emitting surface 13b of the fluorescent material containing member 13 and also being in contact to the light-reflecting member or/and the first glass 12. As shown in FIG. 1C, the second glass 14 is preferably in contact with the fluorescent material containing member 13. Thus, when thermally welded, the second glass 14 can be fixed to the fluorescent material containing member 13 with good adhesion.

As shown in FIG. 1C, when the light-reflecting member 11 is formed with a through-hole, the second glass 14 is preferably placed at a location so that when melted or softened, the second glass 14 covers the opening of the through-hole. Further, when the light emitting surface 13b of the fluorescent material containing member 13 is located lower than the top edge defining the opening of the through-hole, the lower surface of the second glass 14 is preferably smaller than the light emitting surface 13b of the fluorescent material containing member 13. Accordingly, even when the light-reflecting member 11 is formed with a through-hole, the second glass 14 can be brought in contact with the fluorescent material containing member 13, so that the second glass 14 and the fluorescent material containing member 13 can be fixed with good adhesion to each other. Moreover, when fusing the second glass 14, the second glass is allowed to expand in a lateral direction to reach the one or more inner lateral surfaces 11a defining the through-hole. Thus, a gap is hardly formed between the second glass 14 and the one or more inner lateral surfaces 11a.

The second glass 14 can be made of a material that is light-transmissive to light from the light emitting element 21 and fluorescence emitted from the fluorescent material containing member 13. The second glass 14 may have a softening point similar to the softening point of the first glass 12. The second glass 14 includes the second fluorescent material and a glass. Examples of glass include borosilicate glass, soda-lime glass, soda glass, and lead glass. For example, the second glass 14 may be made of a base material of borosilicate glass having a softening point in a range of 500° C. to 900° C. in which a second fluorescent material is dispersed. As described above, mixing of the second fluorescent material and the glass material that is the base material of the second glass 14 is performed when providing the second glass 14, so that the second glass 14 is assumed to contain greater kinds and/or greater amount of additives. For example, when the first glass 12 and the second glass 14 contain borosilicate glass as their base material, BaO is added only to the second glass 14.

With the second glass 14 containing the second fluorescent material, the color of light that cannot be obtained with the used of the first fluorescent material alone can be emitted from the light emitting device 100. When the light emitting device 100 is in operation, a lower density of light due to the fluorescent material containing member 13 enters the second glass 14. This allows selection of the second fluorescent material from materials having the light-resisting properties and/or heat-resisting properties lower than that of the first fluorescent material. For example, the first fluorescent material can be a yellow first fluorescent material such as a YAG phosphor and the second fluorescent material can be a red first fluorescent material such as a CASN phosphor or an α-sialon phosphor.

The content of the second fluorescent material in the second fluorescent material is, for example, in a range of 0.1 to 10 weight %, preferably in a range of 0.5 to 3 weight %, with respect to the total weight of the second glass 14. When the content of the second fluorescent material in the second glass 14 is too large, the light extraction efficiency of the light emitting device 100 decreases. Accordingly, the content of the second fluorescent material in the second glass 14 is preferably smaller than the content of the first fluorescent material in the fluorescent material containing member 13. Further, it is preferable that the fluorescent material contained in the fluorescent material containing member 13 is only the first fluorescent material and the fluorescent material contained in the second glass 14 is only the second fluorescent material. The second glass 14 has a thickness of, for example, in a range of several micrometers to several hundred micrometers. The second glass 14 may contain a light scattering material in place of the second fluorescent material.

(e) Fusing Second Glass

Figure 1D:
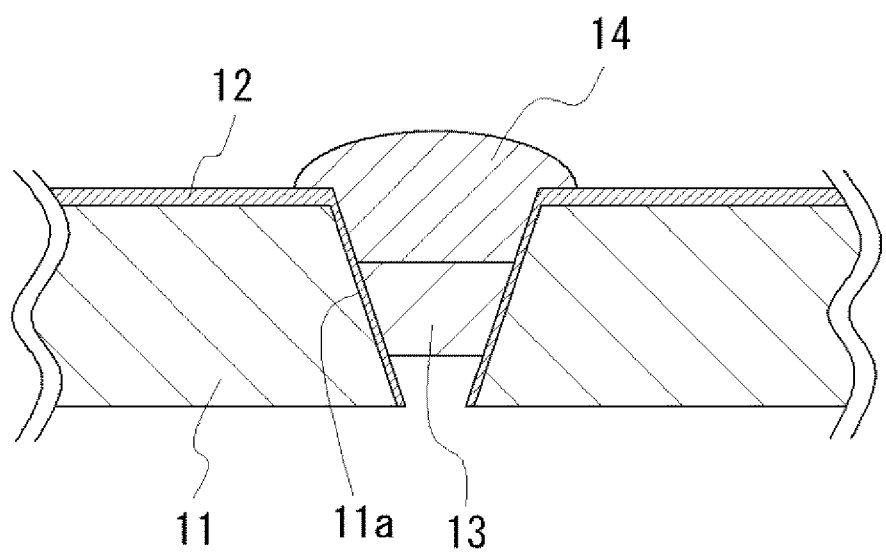
FIG. 1D is a schematic cross-sectional view illustrating a method of manufacturing a light emitting device according to one embodiment of the present invention.

As shown in FIG. 1D, the second glass 14 is thermally welded to the light-reflecting member 11 or the first glass 12 at a second temperature that is lower than the first temperature. The second glass 14 is solid at room temperature, but it will melt or soften at a temperature of heat treatment, and will solidify when returned to room temperature. Thus, covering the light emitting surface 13b side of the fluorescent material containing member 13 with the second glass 14 can reduce the possibility of detachment of the fluorescent material containing member 13 from the light-reflecting member 11. The second glass 14 may be directly in contact with the fluorescent material containing member 13.

As described above, when the first temperature for fusing the first glass 12 is higher, more improvement in the reflectance of the surface provided with the first glass 12 can be achieved. But a high temperature similar to the first temperature gave the second glass 14 clouded appearance. As described above, the second glass 14 tends to be added with more kinds and/or a greater amount of additive than the first glass 12. This is assumed to cause the cloudiness in the second glass 14 when heat treating the second glass 14 at a high temperature. Such a clouded second glass 14 increases scattering of light which causes a reduction in the light scattering material of the light emitting device 100. For this reason, the second temperature is set at a high value to allow fusing of the second glass 14 but lower than the first temperature. Accordingly, the possibility of clouding the second glass 14 can be reduced.

The second temperature used in the manufacturing of the light emitting device 100 can be determined based on pre-test using samples for measurement. For example, the temperature that causes clouding of the second glass 14 can be experimentally determined by using samples for measurement, and set the second temperature at a lower value. The second temperature can be set to, for example, 900° C. or less. Cross-sectional observation of the second glass 14 that is clouded by a heat treatment at 950° C. revealed a large number of foams in the second glass 14, and larger amounts of Ba were detected from the portions containing the foams than other portions. The second glass 14 containing Ba may tend to be clouded, so that the second temperature is preferably set to 900° C. or less. Also, the second temperature is higher than the softening point of the second glass 14, and for example, can be set to 850° C. or greater.

The heat treatment to fusing the second glass 14 can be performed while pressing the second glass 14 to the light-reflecting member 11. With this, the second glass 14 and the light-reflecting member 11 can be adhered more tightly, allowing for firmer fixing. When the positional relationship is as shown in FIG. 1D, pressing the second glass 14 from above allows for tight adhesion of the second glass 14 to both the light-reflecting member 11 and the fluorescent material containing member 13. In order to perform the heat treatment while pressing the second glass 14, for example, the second glass 14 is placed in the furnace with a weight placed on the second glass 14.

Figure 1E:
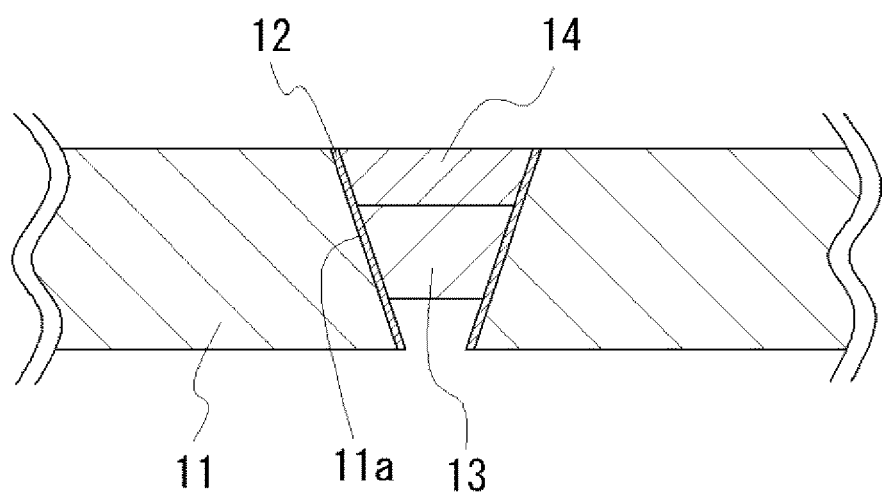
FIG. 1E is a schematic cross-sectional view illustrating a method of manufacturing a light emitting device according to one embodiment of the present invention.

As shown in FIG. 1E, after the second glass 14 is fixed, an upper portion of the second glass 14 may be removed by polishing or the like. The volume of the second glass 14 that contains the second fluorescent material can be adjusted by such removing, so that the color of light to be emitted from the light emitting device 100 can be adjusted. With such removing, the upper surface of the second glass 14 can be made substantially flush with the upper surface of the light-reflecting member 11. The first glass 12 on the upper surface of the light-reflecting member 11 may be removed when removing the upper portion of the second glass 14. This is because, the first glass 12 allows propagation of light, so that when the upper surface of the light-reflecting member 11 has a remaining portion of the first glass 12, light may be emitted through the remaining first glass 12. With removing the remaining first glass 12 from the upper surface of the light-reflecting member 11, the light extracting surface of the light emitting device 100 can be substantially limited to the upper surface of the second glass 14. Accordingly, the luminance of the light emitting device 100 can be improved compared to a case in which the first glass 12 is allowed to remain on the upper surface of the light-reflecting member 11.

(f) Disposing Light Emitting Element

The light emitting element 21 is disposed so that light from the light emitting element 21 is irradiated on the light incident surface 13a of the fluorescent material containing member 13. The light emitting device 100 obtained accordingly is shown in FIG. 2A to FIG. 2C. The light emitting element 21 is, for example, a semiconductor laser element. Laser light emitted by a semiconductor laser element has higher optical density than light emitted from a light emitting diode (LED). With the use of the fluorescent material containing member 13 having better light-resisting properties and heat-resisting properties than that made of a resin, such a high-density light can be irradiated. A light-transmissive member such as sapphire that does not contain a fluorescent material can be arranged at the light incidence surface 13a side of the fluorescent material containing member 13. In this case, light from the light emitting element 21 is irradiated on the fluorescent material containing member 13 through the light-transmissive member.

The light emitting device 100 can be produced, as shown in FIG. 2A to FIG. 2C, by combining a package 20 having the light emitting element 21 with the optical component 10 having the fluorescent material containing member 13 obtained through the steps (a) to (e) as described above. FIG. 2A is a perspective view of appearance of the light emitting device 100, FIG. 2B is a perspective view of the light emitting device 100 with a cross section including the cap 22 and the lens 22 of the package 20, and the optical component 10, along a main route of light. FIG. 2C is an exploded perspective view of the light emitting device 100 shown in FIG. 2B.

The light-reflecting member 11 is held between a presser 15 and a lid 16 and fixed in the optical component 10. The light-reflecting member 11 defines a through-hole. The first glass 12, the fluorescent material containing member 13, and the second glass 14 are arranged in the through-hole as described above. As shown in FIG. 2B, the lid 16 may include a first lid part 16A in contact with the lower surface of the light-reflecting member 11 and a second lid part 16B connected to the lower surface of the first lid part 16A.

The package 20 can include, as shown in FIG. 2B, a stem 24, two lead terminals 25 penetrating the stem 24, a submount 26 fixed on a lateral surface of a protruded part of the stem 24, a light emitting element 21 fixed on the submount 26, and wires 27 electrically connecting the light emitting element 21 and the lead terminals 25 respectively. The package 20 can further include a cap 22 fixed to the stem 24, and a lens 23 fixed to the opening of the cap 22. The lid 16 of the optical component 10 is fixed to the stem 24. The light emitting element 21 is, for example, a semiconductor laser element. As shown by the broken line in FIG. 2B, the laser light emitted from the light emitting element 21 is condensed by the lens 23 to focus before the fluorescent material containing member and enters the fluorescent material containing member 13. When the light emitting device 100 is configured to emit white light, for example, the first fluorescent material contained in the fluorescent material containing member 13 may be a YAG phosphor, and the laser light emitted from the light emitting element 21 is a blue light (peak wavelength in a range of about 400 nm to about 470 nm). For the light emitting element 21 to emit blue laser light, a GaN-based laser element having an active layer including an InGaN well layer can be employed.

According to the steps as described above, the fluorescent material containing member 13 is fixed with two glass members, the first glass 12 and the second glass 14, which allows for obtaining the light emitting device 100 with low possibility of detachment of the fluorescent material containing member 13 while in operation. Moreover, by employing different temperatures for fusing the first glass 12 and fusing the second glass 14, the reflectance of the surface provided with the first glass 12 can be increased and clouding of the second glass 14 can be reduced. Accordingly, a light emitting device 100 of improved optical output can be obtained.

Experiment 1

The first glass 12, the fluorescent material containing member 13, and the second glass 14 were disposed on the light-reflecting member 11 with the procedure illustrated in FIG. 1A to FIG. 1E to obtain an optical member, and luminous flux of a laser light through the optical member was measured. More specifically, the method can be performed as described below.

The light-reflecting member 11 made of zirconium containing alumina and defining a through-hole was provided, and by sputtering, the first glass 12 made of borosilicate glass was disposed on the one or more inner lateral surfaces 11a. The light-reflecting member 11 was provided with a thickness of about 0.7 mm. The through-hole in the light-reflecting member 11 was defined by the one or more inner lateral surfaces 11a of an inverted taper shape, with approximately circular openings with diameters of approximately 0.2 mm at the upper end and approximately 0.65 mm at the lower end. The first glass 12 disposed on the one or more inner lateral surfaces 11a defining the through-hole had a thickness increasing from the lower end to the upper end. The thickness of the first glass 12 at and near the lower end of the through-hole was about 1 µm, at and near the upper end of the through-hole was about 5 µm, and greater than that on the upper surface of the light-reflecting member.

Then, the fluorescent material containing member 13 made of a sintered body of a mixture of $Al_2O_3$ and a YAG phosphor was arranged in the through-hole. The fluorescent material containing member 13 had an inverted taper shape, and the lateral surface of the fluorescent material containing member 13 had a distance to the one or more inner lateral surfaces defining the through-hole smaller at the light emitting surface 13b side than at the light incidence surface 13a side. The content of the YAG phosphor with respect to the total weight of the fluorescent material containing member 13 was about 27 weight %. The fluorescent material containing member 13 had a thickness of about 0.3 mm. Subsequently, at the first temperature, the first glass 12 was thermally welded to the light-reflecting member 11 and the fluorescent material containing member 13. The first temperature was 930° C. and the duration of heat treatment was about 20 minutes. More specifically, the component in which the light-reflecting member 11, the first glass 12, and the fluorescent material containing member 13 being appropriately placed was placed in an electric furnace, the temperature in the furnace was raised to about 930° C. and maintained at about 930° C. for about 20 minutes, and reduced to room temperature.

Then, the second glass 14 mainly containing borosilicate glass and containing an α-sialon phosphor was placed at the light emitting surface 13b side of the fluorescent material containing member 13. The second glass 14 had a hexagonal prism shape and was placed on the light emitting surface 13b so that the bottom surface of the second glass 14 was in contact with the light emitting surface 13b. The content of the α-sialon phosphor with respect to the total weight of the second glass 14 was about 2.5 weight %. The second glass 14 has a thickness of about 0.5 mm. Subsequently, at the second temperature, the second glass 14 was thermally welded to the first glass 12 and the fluorescent material containing member 13. The second temperature was 850° C. and the duration of heat treatment was about 20 minutes. More specifically, the component in which the second glass 14 was appropriately placed was placed in the electric furnace, and the temperature in the furnace was raised to about 850° C. and maintained at about 850° C. for about 20 minutes, and then reduced to room temperature. After thermal welding, the second glass 14 covered the opening of the through-hole at the light emitting side, and spread in contact with the first glass 12 on the upper surface of the light-reflecting member 11. Subsequently, the second glass 14 and the first glass 12 were polished from above so that the upper surface of the second glass 14 and the upper surface of the light-reflecting member 11 are substantially in the same place.

Experiment 2

The optical member was produced in a similar manner as in Experiment 1, except that the first temperature was about 1,000° C.

Experiment 3 for Comparison

In Experiment 3 for Comparison, the optical member was produced in a similar manner as in Experiment 1, except that the first temperature was about 850° C.

A plural number of each of the optical member of Experiments 1 to 3 were provided at substantially the same conditions, and luminous flux of a laser light through each of the optical members was measured. More specifically, a laser light was irradiated on the light incidence surface 13*a* of the fluorescent material containing member 13 and the luminous flux of light emitted through the second glass 14 was measured. A comparison of the average luminous flux of Experiments 1 to 3 shows about 4.4% increase of Experiment 1 compared to that Experiment 3 for Comparison, and about 8.3% increase of Experiment 2 compared to that Experiment 3 for Comparison. From the results shown above, the higher the first temperature, the greater increase in the luminous flux of light through the second glass 14 can be expected.

Example 1

In Example 1, the light emitting device 100 shown in FIG. 2A to FIG. 2C was produced. An optical member was produced with the use of similar materials and method as in Experiment 1 described above. Then, the optical component 10 having the fluorescent material containing member 13 etc., obtained as described above and the package 20 having a semiconductor laser element to emit a laser light of peak wavelength about 450 nm were combined and the light emitting device 100 of Example 1 was obtained. The light emitting device 100 of Example 1 exhibited the luminous flux of about 427.9 lm at an electric current of about 1.7 A.

It is to be understood that although certain embodiments of the present invention have been described, various other embodiments and variants may occur to those skilled in the art, which are within the scope and spirit of the invention, and such other embodiments and variants are intended to be covered by the following claims.

What is claimed is:

1. A method of manufacturing a light emitting device, the method comprising:
    disposing a first glass that does not contain a fluorescent material on a light-reflecting member;
    disposing a fluorescent material containing member on the light-reflecting member via the first glass, wherein either (i) the fluorescent material containing member comprises a ceramic that contains a first fluorescent material, or (ii) the fluorescent material containing member consists essentially of a single crystal of a first fluorescent material;
    heating the first glass that has been disposed on the light reflecting member at a first temperature, so as to fuse the first glass to the fluorescent material containing member and fix the fluorescent material containing member to the light-reflecting member;
    placing a second glass containing a second fluorescent material on a light emitting surface side of the fluorescent material containing member;
    heating the second glass that has been placed on the light emitting surface side of the fluorescent material containing member at a second temperature that is lower than the first temperature, so as to fuse the second glass to at least one of the light-reflecting member and the first; and
    disposing a light emitting element such that light emitted from the light emitting element is irradiated on a light incident surface of the fluorescent material containing member.

2. The method of manufacturing a light emitting device according to claim 1, wherein the first glass is made of borosilicate glass.

3. The method of manufacturing a light emitting device according to claim 2, wherein the first temperature is 930° C. or greater.

4. The method of manufacturing a light emitting device according to claim 1, wherein the second temperature is 900° C. or less.

5. The method of manufacturing a light emitting device according to claim 1, wherein the first fluorescent material is a YAG-phosphor.

6. The method of manufacturing a light emitting device according to claim 1, wherein the light emitting element is a semiconductor laser element.

7. The method of manufacturing a light emitting device according to claim 1, wherein:
    the light-reflecting member defines a through-hole, the fluorescent material member includes one or more lateral surfaces connecting the light incident surface and the light emitting surface,
    in the step of disposing the first glass, the first glass is disposed on the one or more inner lateral surfaces defining the through-hole,
    in the step of fixing the fluorescent material containing member to the light-reflecting member, a lateral surface of the fluorescent material containing member is fixed to the one or more inner lateral surfaces defining the through-hole.

8. The method of manufacturing a light emitting device according to claim 7, wherein, in the step of placing the second glass, the second glass is disposed such that a surface of the second glass facing the fluorescent material containing member is smaller than the light emitting surface of the fluorescent material containing member, and the second glass is in contact with the fluorescent material containing member.

9. A method of manufacturing a light emitting device, the method comprising:
    disposing a first glass that does not contain a fluorescent material on a light-reflecting member, the first glass being made of borosilicate glass;
    disposing a fluorescent material on the light-reflecting member via the first glass, wherein either (i) the fluorescent material containing member comprises a ceramic that contains a first fluorescent material, or (ii) the fluorescent material containing member consists essentially of a single crystal of a first fluorescent material;
    heating the first glass that has been disposed on the light reflecting member at a first temperature of 930° C. or greater, so as to fuse the first glass to the fluorescent material containing member and fix the fluorescent material containing member to the light-reflecting member;
    placing a second glass containing a second fluorescent material on a light emitting surface side of the fluorescent material containing member;
    heating the second glass that has been placed on the light emitting surface side of the fluorescent material containing member at a second temperature of 900° C. or less, so as to fuse the second glass to at least one of the light-reflecting member and the first glass; and disposing a light emitting element such that light emitted from the light emitting element is irradiated on an light incident surface of the fluorescent material containing member.

10. The method of manufacturing a light emitting device according to claim 9, wherein the first fluorescent material is a YAG-phosphor.

11. The method of manufacturing a light emitting device according to claim 9, wherein the second fluorescent material is a CASN phosphor or an α-sialon phosphor.

12. The method of manufacturing a light emitting device according to claim 9, wherein the light emitting element is a semiconductor laser element.

13. The method of manufacturing a light emitting device according to claim 12, wherein the light emitting element is a GaN-based laser element.

\* \* \* \* \*